United States Patent
Perrin

(10) Patent No.: US 6,864,773 B2
(45) Date of Patent: Mar. 8, 2005

(54) VARIABLE FIELD MAGNET APPARATUS

(75) Inventor: Mark A. Perrin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 134 days.

(21) Appl. No.: 10/407,893

(22) Filed: Apr. 4, 2003

(65) Prior Publication Data

US 2004/0196127 A1 Oct. 7, 2004

(51) Int. Cl.⁷ ................................................ H01F 7/02
(52) U.S. Cl. .................. 335/306; 335/298; 204/298.16; 204/298.22; 204/298.37
(58) Field of Search ..................... 204/298.16–298.22, 204/298.37; 324/318–320; 117/917; 335/296–306

(56) References Cited

U.S. PATENT DOCUMENTS

| | | |
|---|---|---|
| 135,690 A | 2/1873 | Churchill |
| 2,832,932 A | 4/1958 | Baermann |
| 3,223,898 A | 12/1965 | Bey |
| 4,055,824 A | 10/1977 | Baermann |
| 4,355,236 A | 10/1982 | Holsinger |
| 4,429,229 A | 1/1984 | Gluckstern |
| 4,482,034 A | 11/1984 | Baermann |
| 4,549,155 A | 10/1985 | Halbach |
| 4,734,621 A | 3/1988 | Yonnet et al. |
| 4,758,813 A | 7/1988 | Holsinger et al. |
| 5,022,017 A | 6/1991 | Jansen et al. |
| 5,252,194 A | 10/1993 | Demaray et al. |
| 5,399,253 A | 3/1995 | Grünenfelder |
| 5,519,373 A | 5/1996 | Miyata |
| 5,660,744 A | 8/1997 | Sekine et al. |
| 6,014,943 A | 1/2000 | Arami et al. |
| 6,190,495 B1 * | 2/2001 | Kubota et al. ......... 156/345.46 |
| 6,193,854 B1 | 2/2001 | Lai et al. |
| 6,217,716 B1 | 4/2001 | Fai Lai |
| 6,320,488 B1 | 11/2001 | Leupold |
| 6,351,075 B1 | 2/2002 | Barankova et al. |
| 6,436,230 B1 * | 8/2002 | Kondo et al. .......... 156/345.46 |
| 6,535,092 B1 * | 3/2003 | Hurley et al. ................ 335/306 |
| 6,764,575 B1 * | 7/2004 | Yamasaki et al. ...... 156/345.46 |
| 2002/0036133 A1 | 3/2002 | Haag et al. |

FOREIGN PATENT DOCUMENTS

| | | |
|---|---|---|
| DE | 4102102 | 8/1992 |
| JP | 4052275 | 2/1992 |

* cited by examiner

Primary Examiner—Ramon M. Barrera
(74) Attorney, Agent, or Firm—Konrad, Raynes & Victor LLP

(57) ABSTRACT

A magnet assembly for producing a varying magnetic field is provided wherein a plurality of permanent magnets are interposed between two members which are constructed of a ferromagnetic material. Each of the magnets is rotatable and has a north and south magnetic pole. Each of the magnets is disposed so that the north magnetic poles of the plurality of permanent magnets have a common magnetic orientation with respect to the first member. An orienter, such as, for example, a ring gear and pinion arrangement, is coupled to the magnets to change their common magnetic orientation with respect to the first member. The magnetic field projected by the assembly varies as a function of the orientation of the magnets.

54 Claims, 3 Drawing Sheets

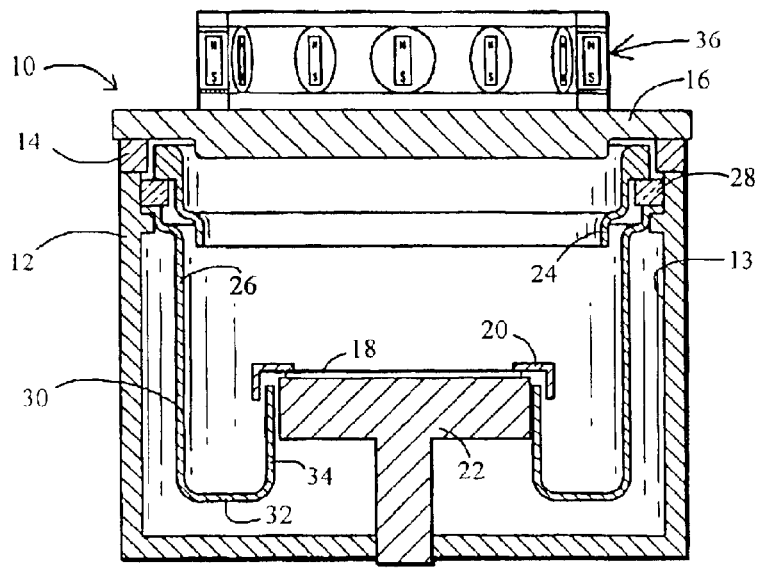
FIG. 1
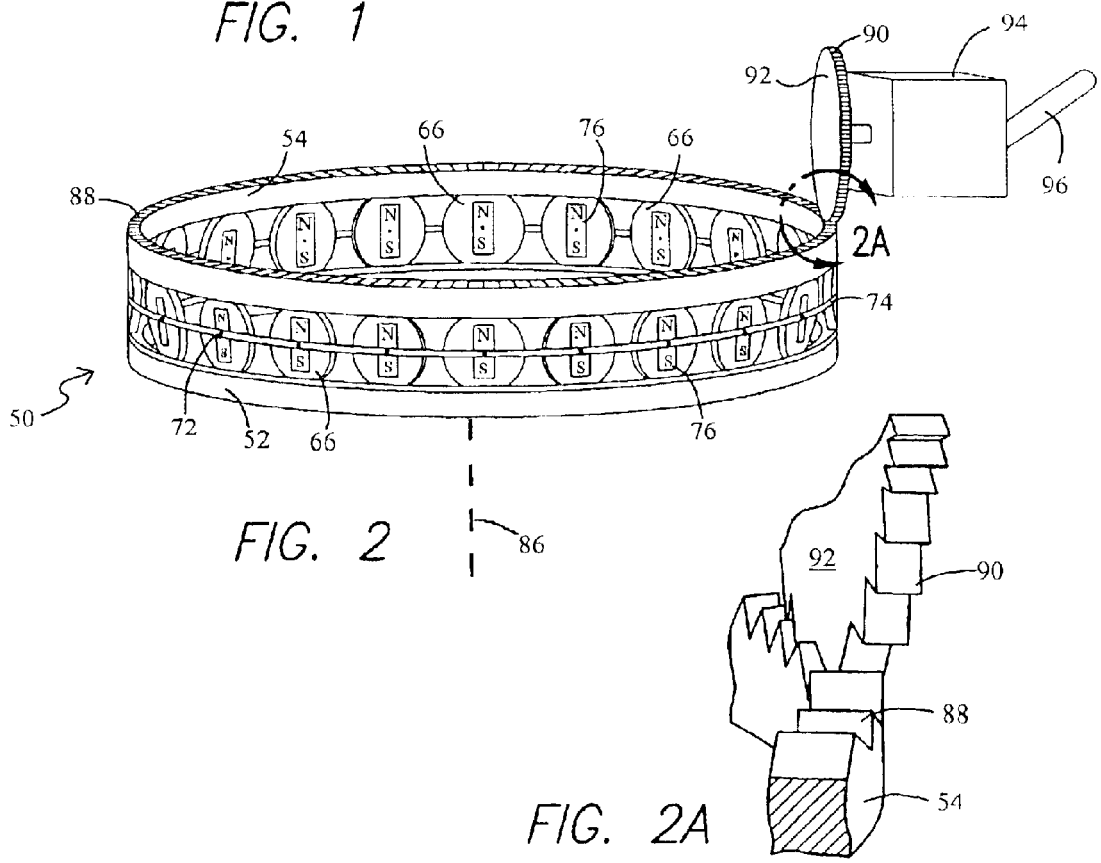
FIG. 2
FIG. 2A

VARIABLE FIELD MAGNET APPARATUS

FIELD OF THE INVENTION

This invention relates in general to the field of magnetic devices, and more particularly, to an apparatus and method for producing with permanent magnets a varying magnetic field, such as for example, a magnetic field as used in semiconductor processing.

BACKGROUND

The need for producing variable magnetic fields arises in a number of industries and fields of endeavor, especially in the manufacturing sectors. One example can be found in the semiconductor processing industry.

Sputtering, alternatively called physical vapor deposition (PVD), is a widely used method of depositing layers of metals and related materials in the fabrication of semiconductor integrated circuits. A conventional PVD reactor includes a vacuum chamber sealed to a PVD target composed of the material, usually a metal, to be sputter deposited on a wafer held on a wafer support, or pedestal. A shield held within the chamber protects the chamber wall from the sputtered material and provides the anode grounding plane. A DC power supply negatively biases the target with respect to the shield. In some designs, the pedestal and hence the wafer are left electrically floating.

A gas source supplies a sputtering working gas, typically the chemically inactive gas argon, to the chamber. A vacuum system maintains the chamber at a low pressure, with a typical working gas pressure in some designs at between about 1 and 1000 mTorr.

When the argon is admitted into the chamber, the DC voltage between the target and the shield ignites the argon into a plasma, and the positively charged argon ions are attracted to the negatively charged target. The ions strike the target at a substantial energy and cause target atoms or atomic clusters to be sputtered from the target. Some of the target particles strike the wafer and are thereby deposited on it, thereby forming a film of the target material.

Advances in semiconductor design have placed increasing demands upon sputtering equipment and processes. Some of the problems are associated with contact and via holes in the semiconductor wafers. Sputtering is often used to fill metal into the vias to provide inter-level electrical connections. In advanced integrated circuit designs, the via holes have increased aspect ratios of three and greater.

Such high aspect ratios present a problem for sputtering because some forms of sputtering are not strongly anisotropic, so that the initially sputtered material preferentially deposits at the top of the hole and may bridge it, thus preventing the filling of the bottom of the hole and creating a void in the via metal.

It has become known, however, that deep hole filling can be facilitated by causing a significant fraction of the sputtered particles to be ionized in the plasma between the target and the pedestal. In some designs, the pedestal, even if left electrically floating, develops a DC self-bias, which attracts ionized sputtered particles from the plasma across the plasma sheath adjacent to the pedestal and deep into the hole in the dielectric layer. The effect can be enhanced with additional DC or RF biasing of the pedestal electrode to additionally accelerate the ionized particles towards the wafer, thereby controlling the directionality of sputter deposition.

One method of increasing the percentage of sputtered atoms which are ionized is to position a magnetron behind the target. Some magnetron designs include opposed magnets creating a magnetic field within the chamber in the neighborhood of the magnets. The magnetic field traps electrons and, for charge neutrality, the ion density also increases to form a high-density plasma region within the chamber adjacent to the magnetron. Some magnetrons are designed to be rotated about the center of the target to achieve full coverage in sputtering of the target.

In some processes, however, it is desirable to be able to produce varying magnetic fields. This need can arise when two or more different processes are performed on the same wafer in the same chamber. Also when new processes and systems are being tested, the magnetic field may need to be varied in order to determine the optimum parameters for the system. Electromagnetic coils traditionally have been used as the source of variable magnetic fields. However these devices can be bulky and expensive to manufacture. Moreover, they can generate a great deal of heat, thus requiring the design and installation of expensive cooling systems. Also, they can present a personnel hazard in the form of electrical shocks. For these reasons, it is desirable to develop a system of permanent magnets which is capable of producing a variable magnetic field.

SUMMARY OF THE ILLUSTRATED EMBODIMENTS

A magnet assembly for producing a varying magnetic field is provided. A plurality of permanent magnets are adapted to project magnetic fields and disposed in an array in a generally closed-loop arrangement, such as for example, a circular arrangement. Each of the magnets has a magnetic north pole and a magnetic south pole which define a magnetic polar axis.

The north pole and magnetic polar axis of each magnet in turn define a magnetic orientation of that magnet, and the magnetic orientations of all of the magnets are positioned in a common magnetic orientation. The projected magnetic fields vary as a function of the common magnetic orientation of the magnets. An orienter is mechanically coupled to the magnets and is adapted to change the common magnetic orientation of the magnets from a first to a second orientation wherein the projected magnetic fields are changed.

In one embodiment, the magnet assembly comprises first and second annular-shaped members having a center axis of rotation and constructed of a ferromagnetic material. The members are disposed in a parallel, spaced-apart relationship with one another. A plurality of permanent magnets are interposed between the two members. Each of the permanent magnets is rotatable about a magnet axis of rotation which is generally perpendicular to the center axis of rotation. The plurality of magnets are disposed so that their magnetic orientations have a common magnetic orientation with respect to the first member.

In one aspect, each of the permanent magnets is a permanent magnetic cylinder. The magnet assembly further comprises a plurality of disks wherein each disk is adapted to carry one magnetic cylinder. Each of the disks is rotatable about a disk axis, wherein the magnetic cylinder has a cylinder axis and is carried by the disk so that the disk axis is generally perpendicular to the cylinder axis. The magnetic polar axis is oriented generally parallel to the cylinder axis.

In another aspect, the magnetic assembly further comprises an annular-shaped frame having a U-shaped cross section formed by a base portion, an outer flange extending axially away from the base portion, and an inner flange extending axially away from the base portion. The frame is adapted to mate with the first or second member so that the member abuts the base portion between the outer and inner flanges.

In an alternative embodiment, the magnet assembly comprises first and second members constructed of a ferromagnetic material and disposed in a parallel, spaced-apart relationship from one another. A plurality of permanent magnets is interposed between the members and rotatively coupled to the first or second member to rotate the magnets at the same angular velocity and in the same rotational direction. The permanent magnets are disposed so that their magnetic orientations have a common magnetic orientation with respect to the first member. Moreover, there are no permanent magnets interposed between the first and second members which have a magnetic orientation which is other than the common magnetic orientation.

In one aspect, the first and second members are ring gears having ring gear teeth. The assembly further comprises a plurality of pinions wherein each of the pinions has pinion teeth meshing with the ring gear teeth and wherein each of the pinions is adapted to carry one of the permanent magnets. The permanent magnets are magnetic cylinders having north and south magnetic ends. Each of the pinions comprises first, second and third portions. The first and second portions are disposed adjacent to the north and south magnetic ends respectively of the cylinder and are constructed of a ferromagnetic material. The third portion is disposed between the first and second pinion portions and is constructed of a non-ferromagnetic material.

In yet another embodiment, a method of depositing material on a semiconductor workpiece using a plasma reactor is provided. A magnetic field is generated in a plasma reactor chamber using a plurality of permanent magnets interposed between first and second members. The first and second members are constructed of a ferromagnetic material and are disposed in a parallel, spaced-apart relationship. The plurality of magnets are disposed so that their magnetic orientations have a common magnetic orientation with respect to the first member. Moreover, there are no permanent magnets interposed between the first and second members which have a magnetic orientation which is other than the common magnetic orientation.

By moving the first or second member which is rotatively coupled to the permanent magnets, the magnets are rotated at the same angular velocity and in the same rotational direction to modify the strength of the magnetic field in the chamber. The semiconductor workpiece is placed in the chamber where a plasma is generated. The material is sputtered with the plasma in a plasma region to produce sputtered material particles.

There are additional aspects to the present inventions. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined by appended claims and their equivalents.

BRIEF DESCRIPTION OF THE DRAWINGS

FIG. 1 is a cross-sectional view of a plasma chamber with a magnet apparatus in accordance with one embodiment of the invention.

FIG. 2 is a perspective view of a magnet apparatus in accordance with another embodiment of the invention.

FIG. 2A is an enlarged perspective view of a portion of a gear arrangement of FIG. 2.

DETAILED DESCRIPTION OF THE PREFERRED EMBODIMENTS

Figure 3:
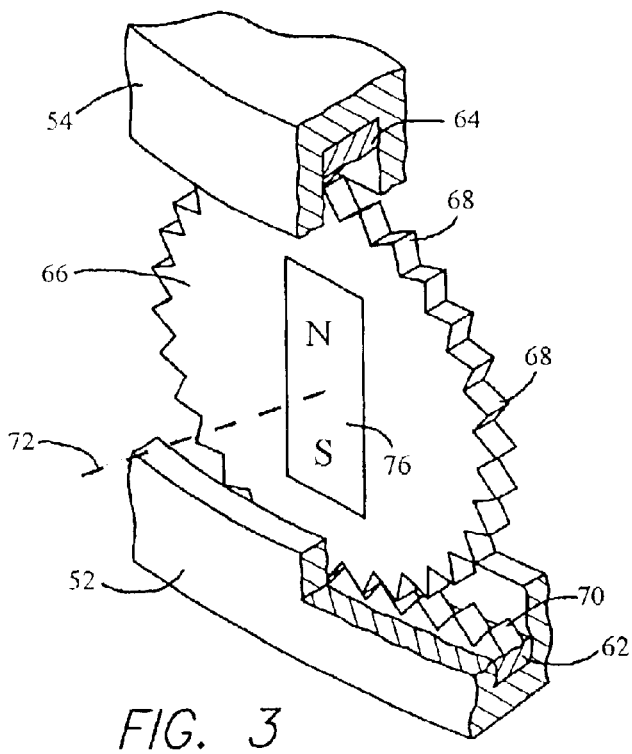
FIG. 3 is a partial cut-away view of frames, ring gears and a pinion in accordance with the embodiment of FIG. 2.

In the following description, reference is made to the accompanying drawings which form a part hereof and which illustrate several embodiments of the present invention. It is understood that other embodiments may be utilized and structural and operational changes may be made without departing from the scope of the present invention.

One embodiment of the present invention includes a plurality of permanent magnets which are in a generally closed-loop arrangement. Each magnet has a magnetic north pole and a magnetic south pole which define a magnetic polar axis. The north pole and polar axis of each magnet, in turn, define a magnetic orientation of the magnet, and the magnetic orientations of the plurality of magnets are positioned in a common magnetic orientation. Thus the magnetic fields projected by the magnets vary as a function of their common magnetic orientation.

A mechanism or orienter is coupled to the plurality of magnets and is adapted to so move the magnets that their common magnetic orientation is changed from a first common magnetic orientation to a second common magnetic orientation. Thus for example, the first common magnetic orientation of the magnets could be the result of the north poles of all magnets being oriented in a vertical direction. On the other hand, the second common magnetic orientation of the magnets could be the result of the north poles all magnets being oriented in a horizontal direction as a result of a movement of the magnets by the orienter. The result of such changed orientation is that the magnetic fields projected by the magnet assembly are changed.

The present invention is intended to be used for the production of varying magnetic fields in a wide variety products and manufacturing processes. However for illustration, the use of the invention in connection with a plasma reactor as used in the semiconductor manufacturing industry is provided.

The plasma reactor 10 of FIG. 1 includes a vacuum chamber 12, usually of metal and electrically grounded, sealed through a target isolator 14 to a sputtering target 16, usually at least a metal surface portion composed of the material to be sputter deposited on a wafer 18. (Although a plasma reactor of a specific design is illustrated herein, it should be appreciated that the magnet assemblies disclosed herein may be used with plasma processing applications of other designs.) A cover ring 20 shields the portion of a pedestal electrode 22 supporting the wafer 18 between the wafer 18 and its edge. Unillustrated resistive heaters, refrigerant channels, and a thermal transfer gas cavity in the pedestal 22 allow the temperature of the pedestal 22 to be cooled to thereby allow the wafer to be similarly cooled.

An electrically floating shield 24 and a grounded shield 26 separated by a second dielectric shield isolator 28 are held within the chamber 12 to protect the chamber wall 13 from being coated by the sputtered material. After extended use, the shields 24, 26 are coated, rather than the wall 13, whereupon they can be quickly replaced by other shields which in turn can eliminate much of the need for cleaning the chamber wall, which consumes valuable production time.

The grounded shield 26 includes a downwardly extending outer portion 30, an inwardly extending bottom portion 32 and an upwardly extending inner portion 34 which terminates close to the wafer clamp 20 and to the top of the wafer pedestal 22. The grounded shield 26 thereby acts as the anode grounding plane in opposition to the cathode target 16, thereby capacitively supporting a plasma. Some electrons deposit on the floating shield 24 so that a negative charge can build up. The negative potential not only repels further electrons from the shield but also confines the electrons to the main plasma area, thus reducing the electron loss, sustaining low-pressure sputtering, and increasing the plasma density.

An unillustrated DC power supply negatively biases the target 16 with respect to the grounded shield 26 to ignite and maintain the plasma. Conventionally, the pedestal 22 and hence the wafer 18 are left electrically floating, but a negative DC self-bias nonetheless develops on them. On the other hand, some designs use a controllable power supply to apply a DC or RF bias to the pedestal to further control the negative DC bias that develops on it.

An unillustrated gas source supplies a sputtering working gas, typically the chemically inactive noble gas argon, to the chamber. The gas enters the main processing space between the target 16 and the wafer 18. An unillustrated vacuum pump system connected to the chamber 12 on the side of the chamber maintains the chamber at a low pressure.

To provide more efficient sputtering, a magnet assembly 36 in accordance with one embodiment of the present invention is positioned in back of the target 16. The assembly 36 produces a magnetic field which traps electrons thus causing the ion density to increase to form a high-density plasma region close to the target 16. As will be discussed in detail below, the assembly 36 is constructed so that the magnetic field can be made to vary.

Figure 5:
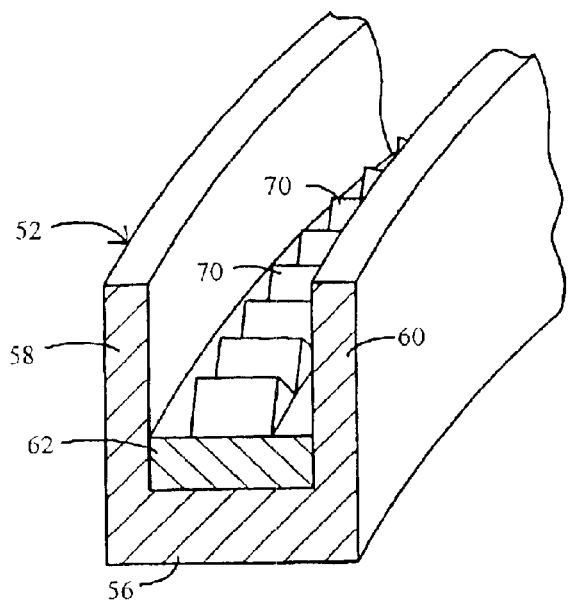
FIG. 5 is a partial cut-away view of one ring gear and frame of FIG. 3.

In accordance with one embodiment of the present invention, a magnet assembly is shown in FIG. 2. The magnet assembly 50 is comprised of first and second annular-shaped frames 52, 54 constructed of a non-ferromagnetic material, such as 304 stainless steel. As best seen in FIG. 5, the first frame 52 has a U-shaped cross section formed by a base portion 56, an outer flange 58 extending axially away from the base portion, and an inner flange 60 extending axially away from the base portion 56.

The first frame 52 is adapted to mate with a first ring gear 62 constructed of a ferromagnetic material, such as for example, 410 stainless steel, so that the gear 62 abuts the base portion 56 of the first frame 52 between the outer flange 58 and inner flange 60. The second frame 54 (FIG. 3) is constructed in a similar manner as the first frame 52 and also is adapted to mate with a second ring gear 64 constructed of a ferromagnetic material. The first frame 52 and first ring gear 62 are disposed in a parallel, spaced-apart relationship with the second frame 54 and second ring gear 64.

A plurality of pinions 66 is interposed between the first and second ring gears and the first and second frames and disposed in an array in a generally circular arrangement. In other embodiments, however, the pinions 66 may be disposed in different closed-loop geometries, such as polygon or elliptical arrangements. As best seen in FIG. 3, each of the pinions 66 has a plurality of teeth 68 which meshes with the teeth 70 of the first and second ring gears 62, 64 so that each pinion 66 is coupled to the first and second ring gears to rotate the plurality of pinions 66 about a pinion axis 72 at the same angular velocity and in the same rotational direction.

In order to assist in preventing the pinions 66 from being forced out of the ring gears as a result of opposing magnetic forces, an annular-shaped band 74 (FIG. 2) is coupled to each of the pinions at the pinion axis 72. In one embodiment, the band 74 is constructed of a non-ferromagnetic material, such as aluminum, in order to minimize the shunting of the magnetic field lines between the pinions 66. Also assisting in holding the pinions 66 in place are the inner flange 60 and the outer flange 58 of the first frame 52, as well as the corresponding flanges of the second frame 54.

Figure 4:
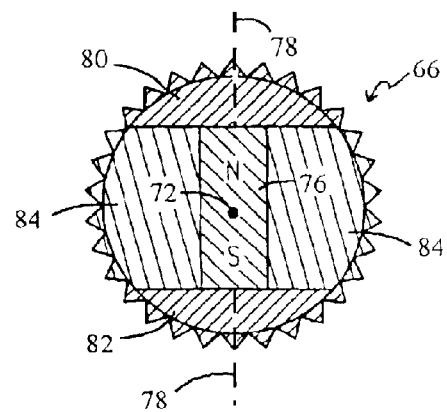
FIG. 4 is a cross section view of the pinion of FIG. 3.
Figure 4A:
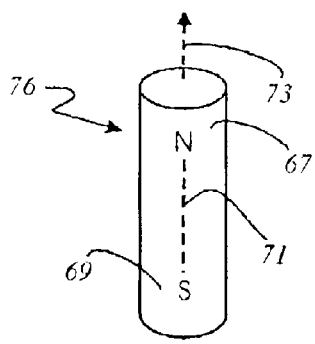
FIG. 4A is a perspective view of the magnetic cylinder of FIG. 4.

Referring to FIGS. 4 and 4A, each pinion 66 carries a permanent magnetic cylinder 76 having a north magnetic pole located at a north end 67 of the cylinder, a south magnetic pole located at a south end 69 of the cylinder and a cylinder axis 78. The north pole and south pole define a magnetic polar axis 71, and the north pole and magnetic polar axis 71 of each magnetic cylinder 76 in turn define a magnetic orientation 73 of the magnet. The cylinder 76 is disposed so that the pinion axis 72 is generally perpendicular to the cylinder axis 78, and the magnetic polar axis 71 is oriented generally parallel to the cylinder axis 78. In FIG. 3, the cylinder 76 is disposed so that its magnetic orientation is pointing toward the second frame 54 and is generally perpendicular to an imaginary plane formed by the second frame 54. However as described below, the magnetic orientation of the cylinder with respect to the second frame 54 will vary as the pinion 66 rotates.

Referring again to FIG. 2, the pinions 66 are disposed in a closed-loop arrangement and are oriented so that the magnetic orientation of each magnetic cylinder 76 is the same as the magnetic orientations of the other cylinders 76 thus forming a common magnetic orientation. That is, the north and south poles of all cylinders are aligned with one another so that the north poles all point in the same direction and the south poles all point in the same direction. For example, in FIG. 2 the magnetic orientations of all magnetic cylinders 76 are the same and provide a common magnetic orientation. That is, all north poles point toward the second frame 54 and are oriented generally perpendicularly to an imaginary plane formed by the second frame 54. Similarly, all south poles point toward the first frame 52 and are oriented generally perpendicular to an imaginary plane formed by the first frame 52.

While the illustrated embodiment describes magnets in cylindrical form, other embodiments may employ magnets having other shapes, such as for example, rectangular or bar shaped magnets. Alternatively, the pinions need not contain or carry separate magnet components at all. Rather, the pinions themselves may be constructed of a material which is magnetized.

As best seen in FIG. 4, each of the pinions 66 further comprises a first pinion portion 80 disposed adjacent to the north magnetic end of the cylinder 76 and a second pinion portion 82 disposed adjacent to the south magnetic end. The first and second pinion portions 80, 82 are constructed of a ferromagnetic material, such as for example 410 stainless steel, in order to allow the magnetic flux lines to pass from the magnetic cylinder to the ring gears at certain orientations of the pinions 66. A third pinion portion 84 is disposed between the first and second pinion portions 80, 82. The third portion 84 is constructed of a non-ferromagnetic material, such as for example, 304 stainless steel, in order to minimize the shunting of the magnetic field lines directly from the north to the south pole within each pinion 66.

In the embodiment of FIG. 2 the first and second frames 52, 54 are annular in shape and have an axis of rotation 86 which is generally perpendicular to the axes of rotation 72 of the pinions. Thus a movement or rotation of the second frame 84 and ring gear 64 relative to the first frame 52 and ring gear 62 will result in a rotation of all of the pinions in the same rotational direction (i.e., clockwise or counterclockwise) and at the same angular velocity. The north and south poles of each of the permanent magnets in each of the pinions will therefore remain aligned with one another, and thus the magnetic orientations of all of the permanent magnets continue to have a common magnetic orientation with respect to the second frame 54.

In the event that the permanent magnets are constructed of rare earth materials, such as NeFeB or NeCo, magnetic fields may be generated of such strength that it may be difficult to manually rotate the frames. As shown in FIGS. 2 and 2A, to accomplish this relative rotation the second frame 54 has a plurality of external gear teeth 88 which are adapted to mesh with teeth 90 of a circular gear 92. This in turn is coupled to an actuator 94, such as for example, a ratchet mechanism, which is adapted for manual operation by a handle 96. Alternatively, the circular gear 92 could be coupled to a motor for automatic or motorized rotation of the second frame 54.

Figure 6:
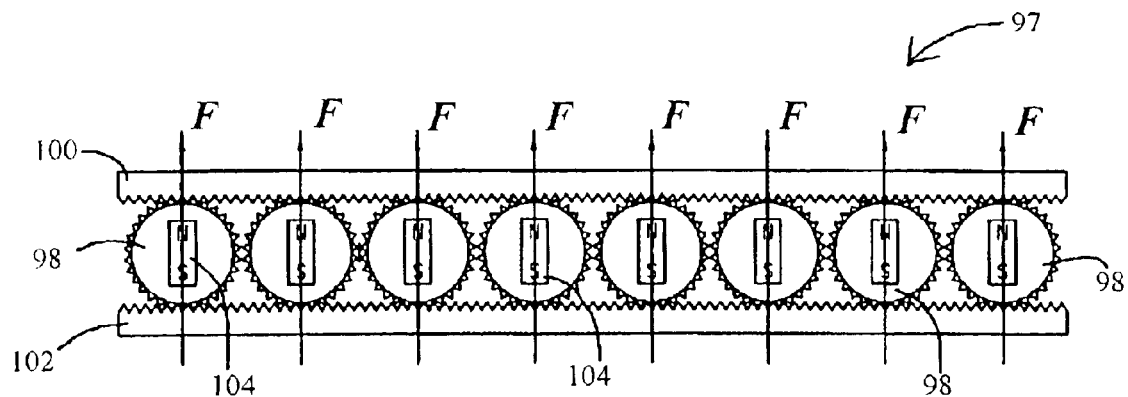
FIG. 6 is a cross section view of a variable field magnetic apparatus showing the magnetic field lines for one orientation of the pinions.
Figure 7:
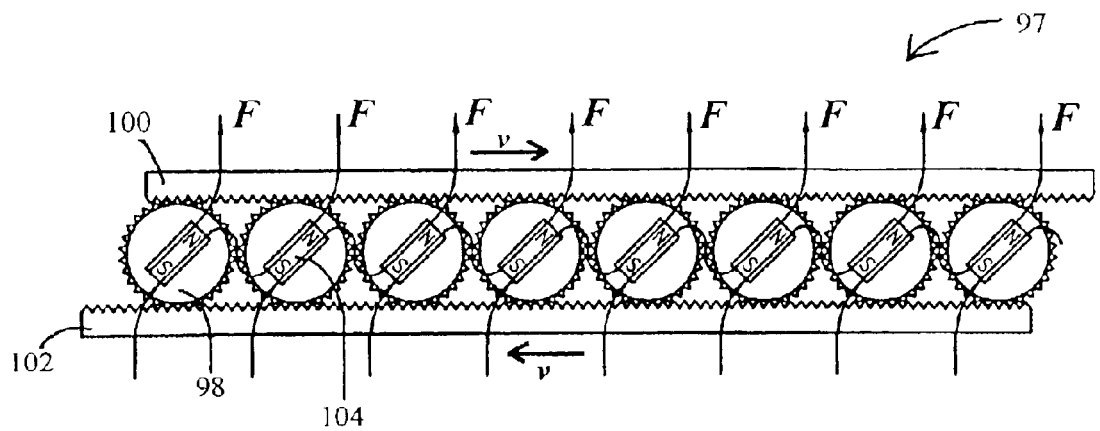
FIG. 7 is a cross section view of the variable field magnetic apparatus of FIG. 6 but with the pinions being in another orientation.
Figure 8:
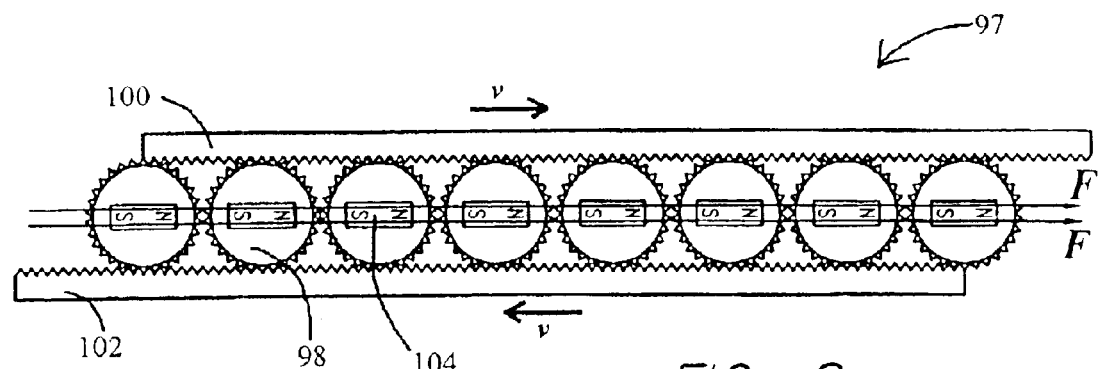
FIG. 8 is a cross section view of the variable field magnetic apparatus of FIG. 6 but with the pinions being in yet another orientation.

FIGS. 6–8 show the magnetic field lines F for various rotational positions of the pinions. For ease and clarity of illustration only, the pinions and ring gears are shown in a straight line rather than the annular arrangement of FIG. 2. In FIG. 6, a magnet array 97 comprises a plurality of pinions 98 which is interposed between first and second ring gears 100, 102 which are both constructed of a ferromagnetic material. Each of the pinions 98 carries a permanent magnetic cylinder 104 having a north magnetic pole located at a north end of the cylinder and a south magnetic pole located at a south end of the cylinder.

The pinions 98 are disposed in an array and are oriented so that the north and south magnetic poles of each magnetic cylinder 104 are generally aligned with the north and south poles of the remaining cylinders 104. Thus the magnetic orientations of the cylinders 104 are positioned in a common magnetic orientation. Moreover, each of the pinions 98 has a plurality of teeth which meshes with the teeth of the first and second ring gears 100, 102 so that each pinion 98 is coupled with the first and second gears 100, 102 to rotate the pinions 98 at the same angular velocity and in the same rotational direction. Thus the magnetic orientation of each magnetic cylinder 104 will remain in a common magnetic orientation as the pinions 98 are rotated.

In FIG. 6, the pinions 98 and magnetic cylinders 104 are oriented so that their common magnetic orientation is perpendicular to imaginary planes formed by the first and second ring gears 100, 102. Magnetic field lines F project outwardly from the gears 100, 102 with minimal magnetic interference or strength reduction. However, a movement of the first gear 100 relative to the second gear 102 for a given distance, as shown by the vectors v in FIG. 7, will cause the pinions 98 and magnetic cylinders 104 to rotate.

Notwithstanding such rotation, the magnetic orientation of each cylinder 104 remains generally aligned with the corresponding magnetic orientations of the other cylinders 104; however, the common magnetic orientation is now at approximately a 45° angle from the the imaginary plane formed by the first ring gear 100. In this orientation, the field lines F which project outwardly from the ring gears are reduced in strength. As seen in FIG. 7, this reduction is due to the partial shunting of the magnetic field lines between adjacent pinions 98 and magnetic cylinders 104.

A further movement of the first gear 100 relative to the second gear 102 for a given distance, as shown by vectors v in FIG. 8, will cause the pinions 98 and magnetic cylinders 104 to rotate so that the magnetic orientation of each cylinder 104 now is approximately parallel to the imaginary plane formed by the first gear 100. In this orientation, very little or no field lines F project outwardly from the gears 100, 102. As seen in FIG. 8, this reduction is due to the nearly complete shunting of the magnetic field lines between adjacent pinions 98 and magnetic cylinders 104. Because the first and second gears 100, 102 are constructed of a ferromagnetic material, they act as pole pieces which assist in minimizing the amount of magnetic flux which is projected outwardly from the gears.

Thus a magnet assembly for producing a varying magnetic field is provided wherein a plurality of permanent magnets are interposed between two members which are constructed of a ferromagnetic material. Each of the magnets is rotatable and has a north and south magnetic pole. Each of the magnets is disposed so that its magnetic orientation is generally aligned with the magnetic orientations of the remaining magnets.

A mechanism, such as for example a ring gear and pinion arrangement, is coupled to the magnets to change their magnetic orientations so that they remain generally aligned with one another. The magnetic field projected by the assembly varies as a function of the orientation of the magnets with respect to the members.

While the description above refers to particular embodiments of the present invention, it will be understood that many modifications may be made without departing from the spirit thereof. The claims are intended to cover such modifications as would fall within the true scope and spirit of the present invention. The presently disclosed embodiments are therefore to be considered in all respects as illustrative and not restrictive, the scope of the invention being indicated by the claims rather than the foregoing description, and all changes which come within the meaning and range of equivalency of the claims are therefore intended to be embraced therein.

What is claimed is:

1. A magnet assembly for producing a varying magnetic field, comprising:

a plurality of permanent magnets adapted to produce magnetic fields and disposed in a generally closed-loop arrangement, each of the magnets having a magnetic north pole and a magnetic south pole which define a magnetic polar axis wherein the north pole and magnetic polar axis of each magnet define a magnetic orientation of the magnet and wherein the magnetic orientations of the plurality of magnets are positioned in a common magnetic orientation and the magnetic fields produced vary as a function of the common magnetic orientation of the plurality of permanent magnets; and an orienter mechanically coupled to the plurality of permanent magnets and adapted to change the common magnetic orientation of the magnets from a first common magnetic orientation to a second common magnetic orientation wherein the magnetic fields are varied.

2. The assembly of claim 1 wherein the orienter includes a plurality of disks, wherein each disk is adapted to carry one of the plurality of magnets and to rotate about a disk axis, the orienter further including a member engaging each of the plurality of disks to rotate the plurality of disks and the plurality of magnets carried by the plurality of disks in unison with one another.

3. The assembly of claim 2 wherein the member is a ring having a ring axis of rotation orthogonal to the disk axis of rotation of each of the disks.

4. The assembly of claim 2 wherein each disk is a pinion gear having pinion teeth and the member is a ring gear having ring teeth meshing with the pinion teeth of each pinion gear.

5. The assembly of claim 4 wherein the ring gear has a ring axis of rotation orthogonal to the disk axes of rotation of each of the disks.

6. A magnet assembly for producing a varying magnetic field, comprising:

a first member constructed of a ferromagnetic material;

a second member constructed of a ferromagnetic material and disposed in a parallel, spaced-apart relationship with the first member; and a plurality of permanent magnets interposed between the first and second members and rotatively coupled to one of the first and second members to rotate the plurality of permanent magnets at the same angular velocity and in the same rotational direction, each of the plurality of permanent magnets having a north magnetic pole and a south magnetic pole which define a magnetic polar axis and wherein the north magnetic pole and the magnetic polar axis of each permanent magnet define a magnetic orientation of the permanent magnet, the plurality of permanent magnets being disposed so that the magnetic orientations of the plurality of permanent magnets have a common magnetic orientation with respect to the first member, and absent any permanent magnets interposed between the first and second members having a magnetic orientation which is other than the common orientation of the plurality of permanent magnets.

7. The magnet assembly of claim 6 wherein the plurality of permanent magnets are rotatively coupled to the other of the first and second members to rotate the plurality of permanent magnets at the same angular velocity and in the same rotational direction.

8. The magnet assembly of claim 7 wherein the first and second members are ring gears having ring gear teeth, the assembly further comprising a plurality of pinions wherein each of the pinions has pinion teeth meshing with the ring gear teeth and wherein each of the pinions is adapted to carry one of the plurality of permanent magnets.

9. A magnet assembly for a plasma reactor having an interior, comprising:

a plurality of permanent magnets disposed in a generally closed-loop arrangement and adapted to be positioned to project magnetic fields within the interior of the reactor, each of the magnets having a magnetic north pole and a magnetic south pole which define a magnetic polar axis wherein the north pole and magnetic polar axis of each magnet define a magnetic orientation of the magnet and wherein the magnetic orientations of the plurality of magnets are positioned in a common magnetic orientation and the magnetic fields produced vary as a function of the common magnetic orientation of the plurality of permanent magnets; and an orienter mechanically coupled to the plurality of magnets and adapted to change the common magnetic orientation of the magnets from a first common magnetic orientation to a second common magnetic orientation wherein the magnetic fields projected within the chamber are changed.

10. The assembly of claim 9 wherein the orienter includes a plurality of disks, wherein each disk is adapted to carry one of the plurality of magnets and to rotate about a disk axis, the orienter further including a member engaging each of the plurality of disks to rotate the plurality of disks and the plurality of magnets carried by the plurality of disks in unison with one another.

11. The assembly of claim 10 wherein the member is a ring having a ring axis of rotation orthogonal to the disk axis of rotation of each of the disks.

12. The assembly of claim 10 wherein each disk is a pinion gear having pinion teeth and the member is a ring gear having ring teeth meshing with the pinion teeth of each pinion gear.

13. The assembly of claim 12 wherein the ring gear has a ring axis of rotation orthogonal to the disk axes of rotation of each of the disks.

14. A magnet assembly for a plasma reactor having an interior, the magnet assembly comprising:

a first annular-shaped member having a center axis of rotation and constructed of a ferromagnetic material;

a second annular-shaped member constructed of a ferromagnetic material and disposed in a parallel, spaced-apart relationship with the first member; and a plurality of permanent magnets interposed between the first and second members and adapted to be positioned to project magnetic fields within the interior of the reactor, each of the permanent magnets being rotatable about a magnet axis of rotation which is generally perpendicular to the first member center axis of rotation and having a north magnetic pole and a south magnetic pole which define a magnetic polar axis and wherein the north magnetic pole and the magnetic polar axis of each permanent magnet define a magnetic orientation of the permanent magnet, the plurality of permanent magnets being disposed so that the magnetic orientations of the plurality of permanent magnets have a common orientation with respect to the first member.

15. The magnet assembly of claim 14 wherein each of the plurality of permanent magnets is a rectangular permanent magnetic bar, the magnet assembly further comprising a plurality of disks wherein each disk is adapted to carry one magnetic bar.

16. The magnet assembly of claim 15 wherein each of the plurality of disks is rotatable about a disk axis, wherein the magnetic bar has a length, width and thickness dimension and is carried by the disk so that the disk axis is generally parallel to the thickness dimension, the magnetic polar axis being oriented generally parallel to the length dimension.

17. The magnet assembly of claim 14 wherein each of the plurality of permanent magnets is a permanent magnetic cylinder, the magnet assembly further comprising a plurality of disks wherein each disk is adapted to carry one magnetic cylinder.

18. The magnet assembly of claim 17 wherein each of the plurality of disks is rotatable about a disk axis, wherein the magnetic cylinder has a cylinder axis and is carried by the disk so that the disk axis is generally perpendicular to the cylinder axis, the magnetic polar axis being oriented generally parallel to the cylinder axis.

19. The magnet assembly of claim 14 further comprising:
a first annular-shaped frame having a U-shaped cross section formed by a first base portion, a first outer flange extending axially away from the first base portion, and a first inner flange extending axially away from the first base portion, the first frame being adapted to mate with one of the first member and the second member so that the one of the first member and the second member abuts the first base portion between the first outer flange and first inner flange.

20. The magnet assembly of claim 14 further comprising an annular-shaped band coupled to each of the plurality of permanent magnets at the magnet axis of rotation of each of the magnets, the band being constructed of a non-ferromagnetic material.

21. A magnet assembly for a plasma reactor having an interior, comprising:
a first member constructed of a ferromagnetic material;
a second member constructed of a ferromagnetic material and disposed in a parallel, spaced-apart relationship with the first member; and
a plurality of permanent magnets interposed between the first and second members and adapted to be positioned to project magnetic fields within the interior of the reactor, the plurality of permanent magnets being rotatively coupled to one of the first and second members to rotate the plurality of permanent magnets at the same angular velocity and in the same rotational direction, each of the permanent magnets having a north magnetic pole and a south magnetic pole which define a magnetic polar axis and wherein the north magnetic pole and the magnetic polar axis of each permanent magnet define a magnetic orientation of the permanent magnet, the plurality of permanent magnets being disposed so that the magnetic orientations of the plurality of permanent magnets have a common orientation with respect to the first member, and absent any permanent magnets interposed between the first and second members having a magnetic orientation which is other than the common orientation of the plurality of permanent magnets.

22. The magnet assembly of claim 21 wherein the plurality of permanent magnets are rotatively coupled to the other of the first and second members to rotate the plurality of permanent magnets at the same angular velocity and in the same rotational direction.

23. The magnet assembly of claim 21 wherein the first and second members are annular in shape.

24. The magnet assembly of claim 22 wherein the plurality of permanent magnets are pinions having pinion teeth and the first and second members are ring gears having ring gear teeth meshing with the pinion teeth of each pinion.

25. The magnet assembly of claim 22 wherein the first and second members are ring gears having ring gear teeth, the assembly further comprising a plurality of pinions wherein each of the pinions has pinion teeth meshing with the ring gear teeth and wherein each of the pinions is adapted to carry one of the plurality of permanent magnets.

26. The magnet assembly of claim 25 wherein each of the plurality of pinions is rotatable about a pinion axis, wherein each of the plurality of permanent magnets comprises a rectangular magnetic bar having a length, width and thickness dimension, the magnetic bar being carried by the pinion so that the pinion axis is generally parallel to the thickness dimension, the magnetic polar axis being oriented generally parallel to the length dimension.

27. The magnet assembly of claim 25 wherein each of the plurality of pinions is rotatable about a pinion axis, wherein each of the plurality of permanent magnets comprises a magnetic cylinder having a cylinder axis, the cylinder being carried by the pinion so that the pinion axis is generally perpendicular to the cylinder axis, the magnetic polar axis being oriented generally parallel to the cylinder axis.

28. The magnet assembly of claim 27 wherein each of the plurality of magnetic cylinders has a north magnetic end and a south magnetic end and wherein each of the plurality of pinions further comprises:
a first pinion portion disposed adjacent to the north magnetic end, the first portion being constructed of a ferromagnetic material;
a second pinion portion disposed adjacent to the south magnetic end, the second portion being constructed of a ferromagnetic material; and
a third pinion portion disposed between the first and second pinion portions, the third portion being constructed of a non-ferromagnetic material.

29. The magnet assembly of claim 23 further comprising:
a first annular-shaped frame having a U-shaped cross section formed by a first base portion, a first outer flange extending axially away from the first base portion, and a first inner flange extending axially away from the first base portion, the first frame being adapted to mate with one of the first member and the second member so that the one of the first member and the second member abuts the first base portion between the first outer flange and first inner flange.

30. The magnet assembly of claim 29 further comprising:
a second annular-shaped frame having a U-shaped cross section formed by a second base portion, a second outer flange extending axially away from the second base portion, and a second inner flange extending axially away from the second base portion, the second frame being adapted to mate with the other of the first member and the second member so that the other of the first member and the second member abuts the second base portion between the second outer flange and second inner flange.

31. The magnet assembly of claim 23 wherein each of the plurality of permanent magnets has an axis of rotation, the magnet assembly further comprising an annular-shaped band coupled to each of the plurality of permanent magnets at the axis of rotation of each of the magnets.

32. The magnet assembly of claim 23 wherein the plurality of magnets are adapted to rotate about a plurality of magnet axes of rotation and wherein one of the first and second members has a member axis of rotation which is generally perpendicular to each of the plurality of magnet axes of rotation, the magnet assembly further comprising an actuator coupled to one of the first and second members to rotate the one of the first and second members about the member axis of rotation, the actuator being adapted for manual operation.

33. The magnet assembly of claim 23 wherein the plurality of magnets are adapted to rotate about a plurality of magnet axes of rotation and wherein one of the first and second members has a member axis of rotation which is generally perpendicular to each of the plurality of magnet axes of rotation, the magnet assembly further comprising a motor coupled to one of the first and second members to rotate the one of the first and second members about the member axis of rotation.

34. The magnet assembly of claim 21 wherein the magnets are disposed in an array.

35. A magnet assembly for a plasma reactor having an interior, comprising:

a first ring gear constructed of a ferromagnetic material;

a second ring gear constructed of a ferromagnetic material and disposed in a parallel, spaced-apart relationship with the first ring gear;

a plurality of pinions interposed between the first and second ring gears and coupled to the first and second ring gears to rotate the plurality of pinions at the same angular velocity and in the same rotational direction, each of the plurality of pinions being rotatable about a pinion axis;

a plurality of permanent magnetic cylinders having a cylinder axis wherein each of the plurality of cylinders is adapted to be carried by one of the plurality of pinions and to be positioned to project magnetic fields within the interior of the reactor and wherein each of the plurality of cylinders has a north magnetic pole and a south magnetic pole which define a magnetic polar axis, wherein the north magnetic pole and the magnetic polar axis of each permanent magnetic cylinder define a magnetic orientation of the permanent magnetic cylinder, the polar axis being oriented generally parallel to the cylinder axis, the cylinder being disposed so that the pinion axis is generally perpendicular to the cylinder axis;

the plurality of pinions being disposed so that the magnetic orientations of the plurality of permanent magnetic cylinders have a common orientation with respect to the first ring gear;

a first annular-shaped frame constructed of a non-ferromagnetic material, the first frame having a U-shaped cross section formed by a first base portion, a first outer flange extending axially away from the first base portion, and a first inner flange extending axially away from the first base portion, the first frame being adapted to mate with the first ring gear so that the first ring gear abuts the first base portion between the first outer flange and first inner flange; and a second annular-shaped frame constructed of a non-ferromagnetic material, the second frame having a U-shaped cross section formed by a second base portion, a second outer flange extending axially away from the second base portion, and a second inner flange extending axially away from the second base portion, the second frame being adapted to mate with the second ring gear so that the second ring gear abuts the second base portion between the second outer flange and second inner flange.

36. An apparatus for processing a semiconductor workpiece, comprising:

a bottom wall;

a side wall connected to the bottom wall, the bottom and side walls forming a cavity;

a semiconductor workpiece support disposed in the cavity a target disposed in the cavity; and a magnet assembly disposed adjacent to the target, the assembly comprising:

a first member constructed of a ferromagnetic material;

a second member constructed of a ferromagnetic material and disposed in a parallel, spaced-apart relationship with the first member; and a plurality of permanent magnets interposed between the first and second members and rotatively coupled to one of the first and second members to rotate the plurality of permanent magnets at the same angular velocity and in the same rotational direction, each of the permanent magnets having a north magnetic pole and a south magnetic pole which define a magnetic polar axis and wherein the north magnetic pole and the magnetic polar axis of each permanent magnet define a magnetic orientation of the permanent magnet, the plurality of permanent magnets being disposed so that the magnetic orientations of the plurality of permanent magnets have a common orientation with respect to the first member, and absent any permanent magnets interposed between the first and second members having a magnetic orientation which is other than the common orientation of the plurality of permanent magnets.

37. The apparatus of claim 36 wherein the first and second members are annular in shape.

38. The apparatus of claim 37 wherein the plurality of permanent magnets are pinions having pinion teeth and the first and second members are ring gears having ring gear teeth meshing with the pinion teeth of each pinion.

39. The apparatus of claim 37 wherein the first and second members are ring gears having ring gear teeth, the apparatus further comprising a plurality of pinions wherein each of the pinions has pinion teeth meshing with the ring gear teeth and wherein each of the pinions is adapted to carry one of the plurality of permanent magnets.

40. The apparatus of claim 39 wherein each of the plurality of pinions is rotatable about a pinion axis, wherein each of the plurality of permanent magnets comprises a rectangular magnetic bar having a length, width and thickness dimension, the bar being carried by the pinion so that the pinion axis is generally parallel to the thickness dimension, the magnetic polar axis being oriented generally parallel to the length dimension.

41. The apparatus of claim 39 wherein each of the plurality of pinions is rotatable about a pinion axis, wherein each of the plurality of permanent magnets comprises a magnetic cylinder having a cylinder axis, the cylinder being carried by the pinion so that the pinion axis is generally perpendicular to the cylinder axis, the magnetic polar axis being oriented generally parallel to the cylinder axis.

42. The apparatus of claim 37 further comprising:

a first annular-shaped frame having a U-shaped cross section formed by a first base portion, a first outer flange extending axially away from the first base portion, and a first inner flange extending axially away from the first base portion, the first frame being adapted to mate with one of the first member and the second member so that the one of the first member and the second member abuts the first base portion between the first outer flange and first inner flange.

43. The apparatus of claim 37 wherein each of the plurality of permanent magnets has an axis of rotation, the apparatus further comprising an annular-shaped band coupled to each of the plurality of permanent magnets at the axis of rotation of each of the magnets.

44. A method of depositing material on a semiconductor workpiece using a plasma reactor, the method comprising:

generating a magnetic field in a plasma reactor chamber using a plurality of permanent magnets interposed between a first member and a second member, the first and second members being constructed of a ferromagnetic material and disposed in a parallel, spaced-apart relationship, each of the permanent magnets having a north magnetic pole and a south magnetic pole which define a magnetic polar axis and wherein the north magnetic pole and the magnetic polar axis of each permanent magnet define a magnetic orientation of the permanent magnet, the plurality of permanent magnets being disposed so that the magnetic orientations of the plurality of permanent magnets have a common orientation with respect to the first member, and absent any permanent magnets interposed between the first and second members having a magnetic orientation which is other than the common orientation of the plurality of permanent magnets;

rotating the plurality of permanent magnets at the same angular velocity and in the same rotational direction to modify the magnetic field in the chamber by moving one of the first and second members, the one of the first and second members being rotatively coupled to the plurality of permanent magnets;

placing the semiconductor workpiece in the chamber;

generating a plasma in the chamber; and sputtering the material with the plasma in a plasma region to produce sputtered material particles.

45. The method of claim 44 wherein the first and second members are annular in shape.

46. The method of claim 45 wherein the plurality of permanent magnets are pinions having pinion teeth and the first and second members are ring gears having ring gear teeth meshing with the pinion teeth of each pinion.

47. The method of claim 45 wherein the first and second members are ring gears having ring gear teeth, and wherein the step of generating the magnetic field further comprises using a plurality of pinions wherein each of the pinions has pinion teeth meshing with the ring gear teeth and wherein each of the pinions is adapted to carry one of the plurality of permanent magnets.

48. The method of claim 47 wherein each of the plurality of pinions is rotatable about a pinion axis, wherein each of the plurality of permanent magnets comprises a rectangular magnetic bar having a length, width and thickness dimension, the bar being carried by the pinion so that the pinion axis is generally parallel to the thickness dimension, the magnetic polar axis being oriented generally parallel to the length dimension.

49. The method of claim 47 wherein each of the plurality of pinions is rotatable about a pinion axis, wherein each of the plurality of permanent magnets comprises a cylinder having a cylinder axis, the cylinder being carried by the pinion so that the pinion axis is generally perpendicular to the cylinder axis, the magnetic polar axis being oriented generally parallel to the cylinder axis.

50. The method of claim 45 wherein the first member is adapted to mate with a first annular-shaped frame having a U-shaped cross section formed by a first base portion, a first outer flange extending axially away from the first base portion, and a first inner flange extending axially away from the first base portion, the first frame being adapted so that one of the first member and the second member abuts the first base portion between the first outer flange and first inner flange.

51. The method of claim 45 wherein the step of rotating the plurality of permanent magnets further comprises manually operating an actuator which is coupled to one of the first and second members so that the one of the first and second members is placed in motion by the actuator.

52. The method of claim 45 wherein the step of rotating the plurality of permanent magnets further comprises energizing a motor coupled to one of the first and second members so that the one of the first and second members is placed in motion by the motor.

53. A magnet assembly for a plasma reactor having an interior, comprising:

means for generating a magnetic field in the plasma reactor interior wherein the generating means includes a plurality of permanent magnets interposed between a first annular-shaped member and a second annular-shaped member, the first and second members being constructed of a ferromagnetic material and disposed in a parallel, spaced-apart relationship, each of the permanent magnets having a north magnetic pole and a south magnetic pole which define a magnetic polar axis and wherein the north magnetic pole and the magnetic polar axis of each permanent magnet define a magnetic orientation of the permanent magnet, the plurality of permanent magnets being disposed so that the magnetic orientations of the plurality of permanent magnets have a common orientation with respect to the first member; and means for rotating the plurality of permanent magnets at the same angular velocity and in the same rotational direction with one of the first and second members to modify the magnetic field in the plasma reactor interior.

54. An apparatus for using a plasma to process a semiconductor workpiece, comprising:

a process chamber having a side wall which defines a cavity;

a target;

means for holding the workpiece in the cavity;

means for generating a magnetic field in the cavity wherein the generating means includes a plurality of permanent magnets interposed between a first annular-shaped member and a second annular-shaped member, the first and second members being constructed of a ferromagnetic material and disposed in a parallel, spaced-apart relationship, each of the permanent magnets having a north magnetic pole and a south magnetic pole which define a magnetic polar axis and wherein the north magnetic pole and the magnetic polar axis of each permanent magnet define a magnetic orientation of the permanent magnet, the plurality of permanent magnets being disposed so that the magnetic orientations of the plurality of permanent magnets have a common orientation with respect to the first member; and means for rotating the plurality of permanent magnets at the same angular velocity and in the same rotational direction with one of the first and second members to modify the magnetic field in the cavity.

* * * * *